United States Patent
Nguyen et al.

(10) Patent No.: US 8,158,451 B2
(45) Date of Patent: Apr. 17, 2012

(54) METHOD FOR MANUFACTURING A JUNCTION

(75) Inventors: Ngoc Duy Nguyen, Sprimont (BE); Roger Loo, Kessel-lo (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/647,773

(22) Filed: Dec. 28, 2009

(65) Prior Publication Data

US 2010/0167446 A1 Jul. 1, 2010

Related U.S. Application Data

(60) Provisional application No. 61/141,197, filed on Dec. 29, 2008.

(51) Int. Cl.
    *H01L 21/00* (2006.01)
(52) U.S. Cl. .......... 438/57; 438/309; 438/496; 438/322
(58) Field of Classification Search .......... 438/45–47, 438/92–94, 170, 172, 234, 235
    See application file for complete search history.

(56) References Cited

U.S. PATENT DOCUMENTS

| | | | |
|---|---|---|---|
| 4,825,265 A | 4/1989 | Lunardi et al. | |
| 4,835,579 A * | 5/1989 | Ishibashi et al. | 257/17 |
| 4,859,627 A | 8/1989 | Sunakawa | |
| 5,162,256 A | 11/1992 | Jurgensen | |
| 5,332,689 A * | 7/1994 | Sandhu et al. | 438/491 |
| 5,532,185 A | 7/1996 | Akamine et al. | |
| 7,122,733 B2 * | 10/2006 | Narayanan et al. | 136/249 |
| 2002/0081764 A1 | 6/2002 | Springthorpe et al. | |
| 2005/0181566 A1 | 8/2005 | Machida et al. | |
| 2007/0048953 A1 * | 3/2007 | Gealy et al. | 438/305 |
| 2007/0222032 A1 * | 9/2007 | Schaefer et al. | 257/565 |
| 2007/0269953 A1 | 11/2007 | Meinhardt et al. | |

FOREIGN PATENT DOCUMENTS

| | | |
|---|---|---|
| EP | 0430274 A2 | 6/1991 |
| EP | 0430274 A3 | 6/1991 |
| WO | WO00/13206 | 3/2000 |

(Continued)

OTHER PUBLICATIONS

Theunissen, M.J.J. et al. "Boron Vapour Phase Doping of Silicon for Bipolar Device Applications", Jpn. J. Appl. Phys., vol. 38, Part 1, No. 10, Oct. 1999, pp. 5805-5814.

(Continued)

*Primary Examiner* — Kevin M Picardat
*Assistant Examiner* — Neil Prasad
(74) *Attorney, Agent, or Firm* — McDonnell Boehnen Hulbert & Berghoff LLP

(57) ABSTRACT

The present invention relates to a semiconductor device comprising a homojunction or a heterojunction with a controlled dopant (concentration) profile and a method of making the same. Accordingly, one aspect of the invention is a method for manufacturing a junction comprising forming a first semiconductor material comprising a first dopant having a first concentration and thereupon; forming a second semiconductor material comprising a second dopant, having a second concentration thereby forming a junction, and depositing by Atomic Layer Epitaxy or Vapor Phase Doping at least a fraction of a monolayer of a precursor suitable to form the second dopant on the first semiconductor material, prior to forming the second semiconductor material, thereby increasing the second concentration of the second dopant at the junction.

18 Claims, 6 Drawing Sheets

FOREIGN PATENT DOCUMENTS

WO    WO 2007121524 A1 * 11/2007

OTHER PUBLICATIONS

Nishizawa, J. et al., "Ultrashallow, High Doping of Boron Using Molecular Layer Doping", Appl. Phys. Lett., vol. 56, No. 14, Apr. 2, 1990, pp. 1334-1335.

Shimamune, Y. et al., "Atomic-Layer Doping in Si by Alternately Supplied PH3 and SiH4", Thin Solid Films, vol. 380, 2000, pp. 134-136.

Kiyota, Yukihiro et al., "Ultra-Thin-Base Si Bipolar Transistor Using Rapid Vapor-Phase Direct Doping (RVD)", IEEE Transactions on Electron Devices, vol. 39, No. 9, Sep. 1992, pp. 2077-2081.

Kalkofen, Bodo et al., "A Simple Two-Step Phosphorus Doping Process for Shallow Junctions by Applying a Controlled Adsorption and a Diffusion in an Oxidising Ambient", Materials Science and Engineering, B 114-115, 2004, pp. 362-366.

Uchino, Takashi et al., "Very-High-Speed Silicon Bipolar Transistors with In-Situ Doped Polysilicon Emitter and Rapid Vapor-Phase Doping Base", IEEE Transactions on Electron Devices, vol. 42, No. 3, Mar. 1995, pp. 406-412.

Saitoh, Naota et al., "Composition and Growth Mechanisms of a Boron Layer Formed Using the Molecular Layer Doping Process", Jpn. J. Appl. Phys., vol. 32, 1993, pp. 4404-4407.

Kiyota, Yukihiro et al., "Reduction of Base Resistance and Increase in Cutoff Frequency of Si Bipolar Transistor Using Rapid Vapor-Phase Doping", Jpn J. Appl. Phys., vol. 39, 2000, pp. 1987-1991.

* cited by examiner

METHOD FOR MANUFACTURING A JUNCTION

CROSS-REFERENCE TO RELATED APPLICATIONS

This application claims the priority of U.S. Provisional Patent Application Ser. No. 61/141,197, filed Dec. 29, 2008, which is hereby incorporated herein by reference in its entirety.

TECHNICAL FIELD OF THE INVENTION

The present invention relates to a semiconductor device comprising a homojunction or a heterojunction with a controlled dopant (concentration) profile and a method of making the same. For example, the present invention can be suitably applied in the manufacturing of a bipolar device for BiCMOS technology or of a photovoltaic device having a controlled dopant (concentration) profile at the emitter-base interface.

BACKGROUND OF THE INVENTION

In the npn (pnp) bipolar transistor, the emitter layer consists of n-type (p-type) semiconducting material that is deposited on top of the epitaxially-grown base structure. The emitter itself is either polycrystalline or monocrystalline. A monocrystalline emitter is preferred from the point of view of device integration because it allows for a reduction of parasitic resistance and enables band gap engineering of the emitter stack in the perspective of optimization of the transistor performances. In both cases, high dopant concentration (above $1\times10^{20}$ atoms/cm$^3$) is desired in order to achieve a low-resistance emitter layer.

Nowadays the fabrication of a bipolar transistor is performed in a BiCMOS process flow, which means that the thermal anneal that drives the dopants from the emitter layer into the base layer also serves as junction activation anneal for the CMOS part of the device. This step, which consists of a spike anneal occurring after the deposition of the emitter layer, is usually fixed by the optimization of the CMOS part of the process flow and provides a relatively high thermal budget which might adversely impact the bipolar device characteristics.

SUMMARY OF THE INVENTION

In one aspect, the present invention provides a method for controlling the dopant concentration profile at the emitter-base interface of a bipolar transistor.

More particularly, in certain embodiments the present invention provides a method for controlling a dopant overshoot (or a dopant concentration peak) at the emitter-base interface of a bipolar transistor.

Furthermore, in one aspect, the present invention provides a method for improving the control of the doping profile at the emitter-base interface of a bipolar transistor (when compared to methods described in the art).

The present invention provides in certain embodiments a method for controlling the in-diffusion depth of the dopants at the emitter-base interface of a bipolar transistor upon a rapid thermal treatment.

More particularly, in certain embodiments the present invention provides a method for improving the control of the in-diffusion depth of the dopants at the emitter-base interface of a bipolar complementary metal-oxide-semiconductor (BiCMOS), upon applying the activation anneal of the complementary metal-oxide-semiconductor (CMOS) flow (when compared to methods described in the art).

In one aspect, the present invention provides a method for forming a highly doped semiconductor layer in a bipolar transistor having a dopant concentration exceeding (or above) the dopant solid solubility.

According to one aspect of the present invention, a method is provided for manufacturing a junction with a controlled dopant (concentration) profile comprising (or consisting of, or consisting essentially of):

forming a first semiconductor material comprising a first dopant having a first concentration and thereupon forming a second semiconductor material comprising a second dopant, having a second concentration thereby forming a junction, and depositing by Atomic Layer Epitaxy or Vapor Phase Doping at least a fraction of a monolayer of a precursor suitable to form the second dopant on the first semiconductor material, prior to forming the second semiconductor material, thereby increasing the second concentration of the second dopant at the junction. Said increase of the second concentration is defined as a higher concentration of the second dopant at the junction with respect to the second concentration of the second dopant in the second semiconductor material (or bulk concentration of the second dopant in the emitter region).

In the context of the present invention, a controlled dopant (concentration) profile refers to a steep (or abrupt or box-shaped or sharp) (concentration) profile of the second dopant at the junction in the as-deposited structures/layers.

More particularly, in one embodiment of a method of the present invention, the second concentration of the second dopant is increased locally (or an overshoot is created) at the junction. Otherwise stated, the second dopant (concentration) profile at the junction is controlled by steepening the second dopant (concentration) profile at the emitter-base junction.

In one embodiment of a method of the invention, the first semiconductor material can be a monolayer, or can comprise multiple layers, each of them being epitaxially grown. Said monolayer is a single layer of semiconductor material, in contrast with e.g. said multiple layers.

In one embodiment of a method of the invention, the first concentration of the first dopant in the first semiconductor material can be between (about) $10^{18}$ atoms/cm$^3$ and (about) $10^{19}$ atoms/cm$^3$, preferably lower than $1\times10^{20}$ atoms/cm$^3$.

In the context of the present invention, a fraction of a monolayer of a precursor refers to the deposition of less than one monolayer of said precursor on the surface (of a semiconductor material), whereby said surface is not fully covered with said precursor (i.e. incomplete coverage of the surface). Furthermore, it is to be understood that clustering of said precursor does not occur in said fraction of said monolayer.

In the context of the present invention, one monolayer (or one ML, or one single atomic layer) of a precursor refers to the deposition of said precursor on the surface (of a semiconductor material), whereby said surface is fully covered with said precursor. Furthermore, it is to be understood that clustering of said precursor does not occur in said monolayer.

Preferably, in one embodiment of a method according to the invention, the first semiconductor material and the second semiconductor material have the same composition, thereby forming a homojunction.

Preferably, in one embodiment of a method according to the invention, the first semiconductor material and the second semiconductor material have different compositions, thereby forming a heterojunction.

Preferably, in one embodiment of a method according to the invention, forming the second semiconductor material comprises performing a sequence comprising, consisting essentially of or consisting of epitaxially growing a layer of a second semiconductor material and thereupon depositing by Atomic Layer Epitaxy a monolayer of a precursor suitable to form the second dopant; and repeating the sequence at least twice, thereby incorporating the second dopant in substitutional sites in the second semiconductor material.

Preferably, in one embodiment of a method according to the invention, the second concentration of the second dopant in the second semiconductor material is higher or equal to $1 \times 10^{200}$ cm$^{-3}$.

Preferably, in one embodiment of a method according to the invention, the second dopant is a n-type dopant.

Preferably, the n-type dopant is arsenic (As) or phosphorus (P).

Preferably, the precursors suitable to form the n-type dopant are arsine ($AsH_3$) or phosphine ($PH_3$).

Preferably, in one embodiment of a method according to the invention, the first dopant is a p-type dopant.

Preferably, the p-type dopant is boron.

Preferably, in one embodiment of a method according to the invention, the second semiconductor material comprises Si, Ge or combinations thereof.

Preferably, in one embodiment of a method according to the invention, the second semiconductor material is an emitter region of a bipolar transistor.

Preferably, in one embodiment of a method according to the invention, the first semiconductor material comprises Si, Ge or combinations thereof.

Preferably, in one embodiment of a method according to the invention, the first semiconductor material is a base region of a bipolar transistor.

Preferably, a method according to the invention further comprises a rapid thermal treatment (or rapid thermal anneal (RTA) or spike anneal).

In one embodiment of a method of the invention, said rapid thermal treatment is performed after the step of forming a second semiconductor material.

According to one aspect of the invention, said rapid thermal treatment is performed after the step of forming a second semiconductor material, at the same time (or simultaneously) with the activation anneal of the CMOS device.

Certain embodiments of the present invention provide a method for controlling the in-diffusion depth of the dopants at the emitter-base interface of a bipolar transistor upon a rapid thermal treatment.

In the context of the present invention, the in-diffusion depth (or electrical junction depth or (in-)diffusion length) of the dopants refers to the depth to which said dopants are diffused into the base region upon performing a rapid thermal anneal.

In one embodiment of a method of the invention, said rapid thermal treatment is performed using any method known in the art, more preferably by rapid thermal anneal, by laser anneal or flash anneal.

Preferably, the temperature of said rapid thermal anneal (or spike anneal) is between (about) 1050° C. and (about) 1200° C., more preferably (about) 1100° C.

Preferably, the rapid thermal treatment is a typical HDD (highly doped drain) activation anneal used in CMOS technology.

Preferably, an in-diffusion depth of Arsenic (As) into the first semiconductor material is lower or equal to 15 nm upon (performing) the rapid thermal treatment.

According to another aspect, the present invention relates to the use of a method as above described for the manufacture of a bipolar CMOS (BiCMOS) device.

In still another aspect, the present invention relates to the use of a method as above described for the manufacture of a photovoltaic device.

DETAILED DESCRIPTION OF THE INVENTION

In the context of the present invention, a metallurgical (emitter-base) junction refers to the physical junction between the emitter region and the (base cap of the) base region of a bipolar transistor. In the context of the present invention, an (emitter-base) interface (region) or transition region refers to the region from the metallurgical junction up to (and including) the SiGe2 region. In the context of the present invention, a top surface of the base region refers to the starting surface for depositing the emitter (region) onto the base (region).

In the context of the present invention, an electrical (emitter-base) junction refers to the emitter-base n-p heterojunction being electrically activated upon performing a rapid thermal anneal. The electrical junction is positioned at the intersection between the n-type dopant concentration profile and the p-type dopant concentration profile upon performing the thermal anneal.

Figure 1A:
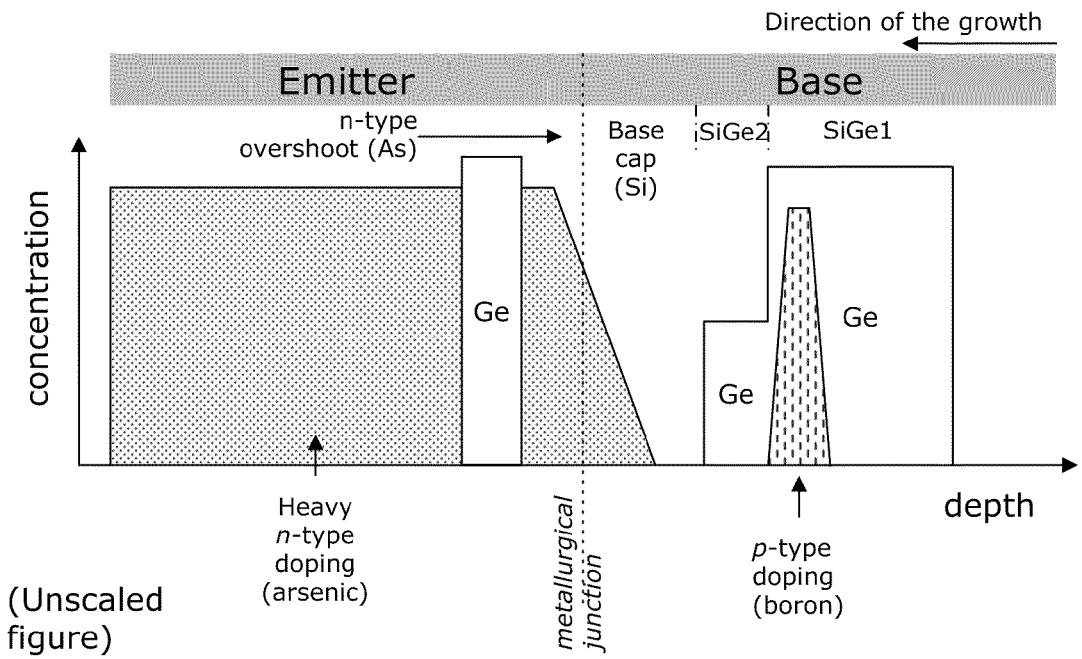
FIG. 1a represents schematically the emitter-base heterojunction (Si/SiGe) of a bipolar transistor, wherein the emitter is n-type heavily doped and the base is p-type doped (before performing a rapid thermal anneal).
Figure 1B:
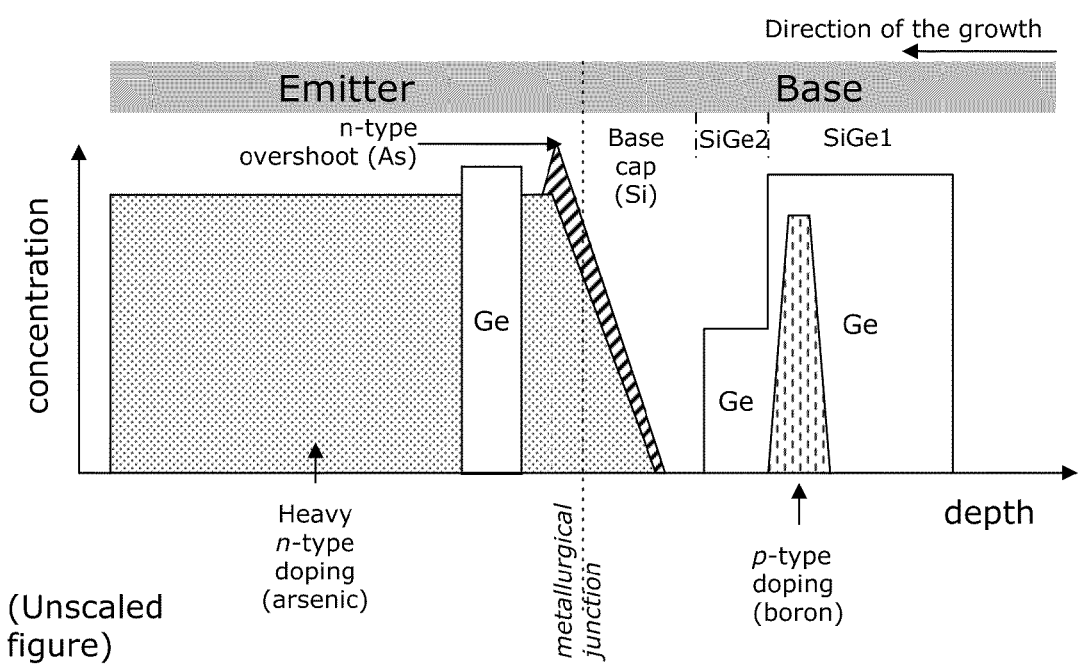
FIG. 1b represents schematically the emitter-base heterojunction (Si/SiGe) of a bipolar transistor, wherein the emitter is n-type heavily doped and the base is p-type doped, having an overshoot (or concentration peak magnitude) of the n-type dopant (As) present at the emitter-base metallurgical junction (before performing a rapid thermal anneal). Said overshoot of the n-type dopant (As) may then be used as a reservoir of n-type dopant (As) for adjusting the concentration profile of said dopant, during (or upon performing) a subsequent rapid thermal anneal (i.e. diffusion of said dopant into the base region).
Figure 5A:
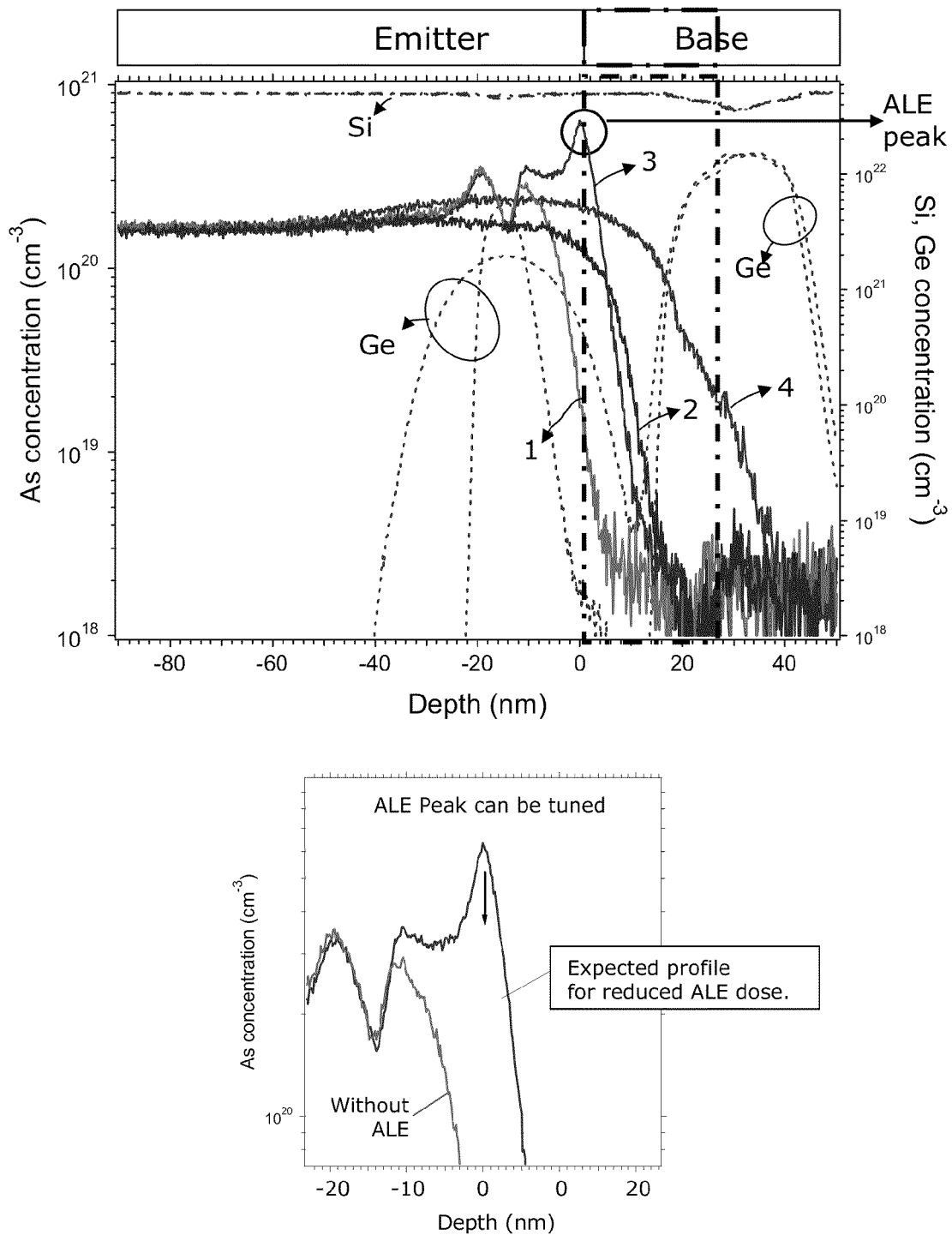
FIG. 5a shows the Arsenic (As), Germanium (Ge), Silicon (Si) concentration as measured by secondary ion mass spectrometry (SIMS) (the transition region between the emitter region and the (base cap of the) base region is indicated on top of said figure). The origin of the depth scale is at the top surface of the base region (or metallurgical junction): (curve 1) no anneal, without ALE; (curve 2) with anneal, without ALE; (curve 3) no anneal, with ALE; (curve 4) with anneal, with ALE. The (rapid) thermal anneal was performed at 1085° C. (spike anneal). In the right figure of FIG. 5a (i.e. depicting a zoom of curve 1 and curve 3) the expected profile for reduced ALE dose (submonolayer) is simulated.
Figure 5B:
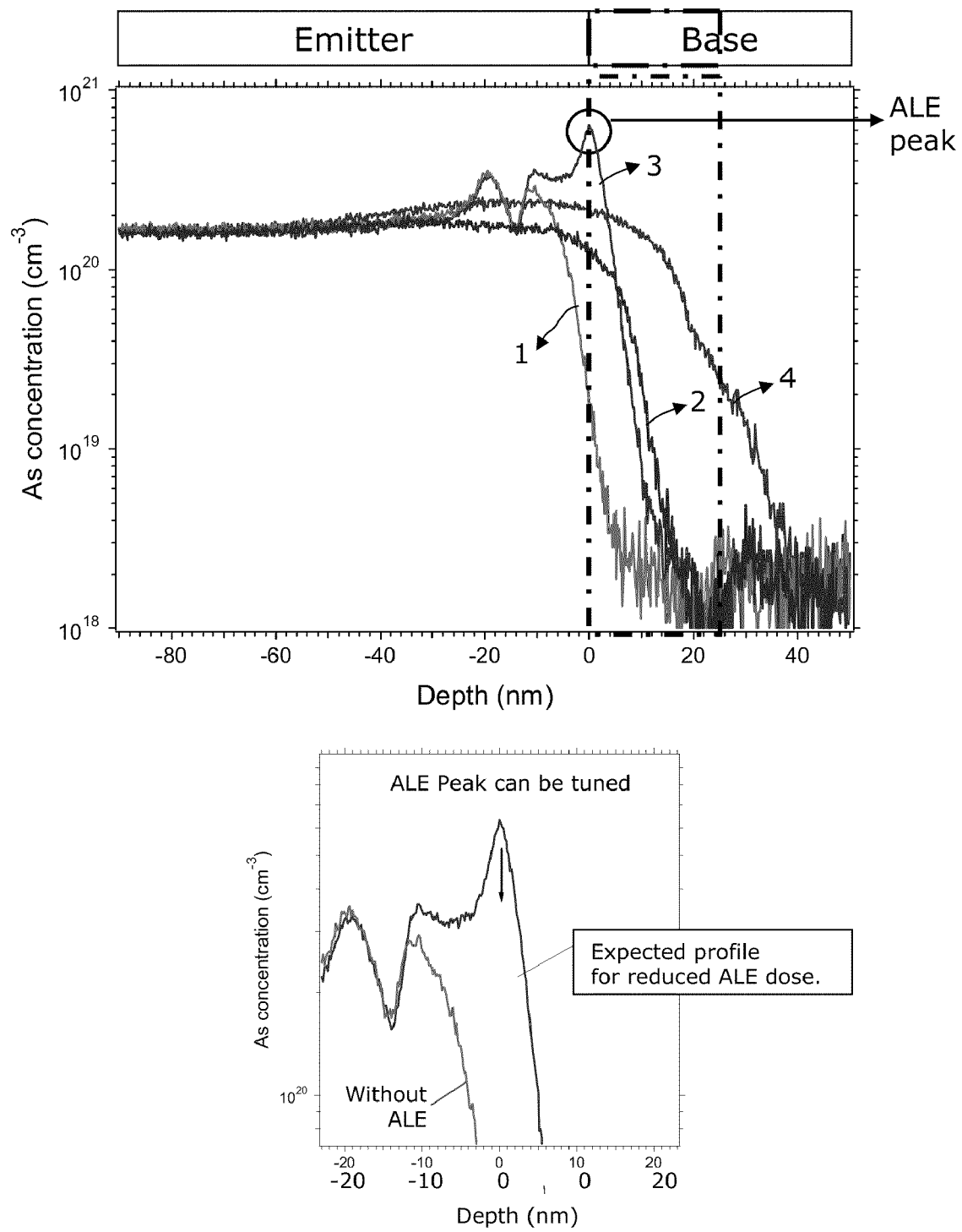
FIG. 5b shows only the Arsenic (As) concentration (as represented in FIG. 5a) as measured by secondary ion mass spectrometry (SIMS).

In the context of the present invention, an abrupt (or box-shaped, sharp, or steep) dopant (concentration) profile at the emitter-base interface refers to a dopant (concentration) profile represented by a curve of the dopant concentration versus the depth of the substrate, said curve having a steep slope (such as represented e.g. in FIG. 1a, 1b, or in FIG. 5a, 5b (curve 3)). More particularly, the slope of said curve (i.e. doping concentration decrease per nm depth) should be as steep as possible. Typically a steep curve shows about 1 decade decrease in doping concentration for 1.5 nm to 3 nm depth. Upon performing the rapid thermal anneal said slope is less steep (or less abrupt) and shows a kink (such as represented e.g. in FIG. 2a, 2b, or in FIG. 5a, 5b (curve 4)) due to the diffusion of the dopant into the base region.

One aspect of the invention relates to a semiconductor device comprising a homojunction or a heterojunction with a controlled dopant (concentration) profile and a method of making the same.

Another aspect of the invention relates to a method for manufacturing a bipolar device (suitable for BiCMOS technology) having a controlled dopant (concentration) profile at the emitter-base interface and a controlled in-diffusion depth for a (pre-determined) rapid thermal treatment compatible with the conventional CMOS flow. Preferably, the dopant (concentration) profile at the (emitter-base) interface is steep (i.e. abrupt/box-shaped).

Another aspect of the invention relates to a method for manufacturing a photovoltaic device having a controlled dopant (concentration) profile at the emitter-base interface. Preferably, the dopant (concentration) profile at the interface is steep (i.e. abrupt/box-shaped).

Yet another aspect of the invention relates to a method for forming a highly doped semiconductor layer for a photovoltaic device (e.g. an emitter layer) having a dopant concentration exceeding the dopant solid solubility.

Another aspect of the present invention relates to a method for forming for forming a highly doped semiconductor layer in a tunnel Field Effect Transistor (FET) having a dopant concentration exceeding the dopant solid solubility.

Various aspects of the present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes.

In a bipolar transistor an electrical junction is (typically) formed between an emitter region and a base region.

In case of a npn bipolar transistor, the emitter region comprises a n-type heavily-doped semiconductor material and the base region comprises a p-type doped semiconductor material (the emitter layer being deposited on top of the surface of the epitaxially-grown base structure).

In case of a pnp bipolar transistor, the emitter region comprises a p-type heavily-doped semiconductor material and the base region comprises a n-type doped semiconductor material (the emitter layer being deposited on top of the surface of the epitaxially-grown base structure).

The base region can comprise multiple layers, each of them being epitaxially grown. For the purpose of illustration, the direction of growth is e.g. indicated by the arrow in the upper (right) corner of FIG. 1a (and FIG. 1b).

Different embodiments of the invention disclose a base region comprising Si and/or SiGe. Optionally, the concentration of Ge has a flat (i.e., relatively constant) profile. Alternatively, the concentration of Ge has a ramped profile towards the top surface (of said base region), or a ramped profile towards the substrate.

In one particular embodiment of the invention a base region is disclosed having a 2-step Ge profile. More specifically the base region comprises a layer of SiGe with a first Ge concentration (SiGe1 in e.g. FIG. 1a and FIG. 1b), thereupon a second SiGe layer with a second Ge concentration (SiGe2 in e.g. FIG. 1a and FIG. 1b) and a base cap layer of Si. Preferably, the second Ge concentration is lower than the first Ge concentration The emitter region comprises a heavily-doped semiconductor material which can be either polycrystalline or monocrystalline. A monocrystalline emitter is preferred from device integration point of view since it allows a reduction of parasitic resistance and enables band gap engineering of the emitter stack. Throughout the description, a heavily doped semiconductor material is defined as a semiconductor material having a dopant concentration above (about) $1 \times 10^{20}$ atoms/cm$^3$. The heavily doped emitter is required in order to achieve low-resistance emitter region.

FIG. 1a (and FIG. 1b) shows schematically a Si/SiGe heterojunction bipolar transistor before applying (rapid) thermal treatment (or anneal). The optional (epitaxially grown) Ge peak in the emitter region is designed to improve the device operation by increasing the base current without degradation of the high-frequency performance.

Figure 2A:
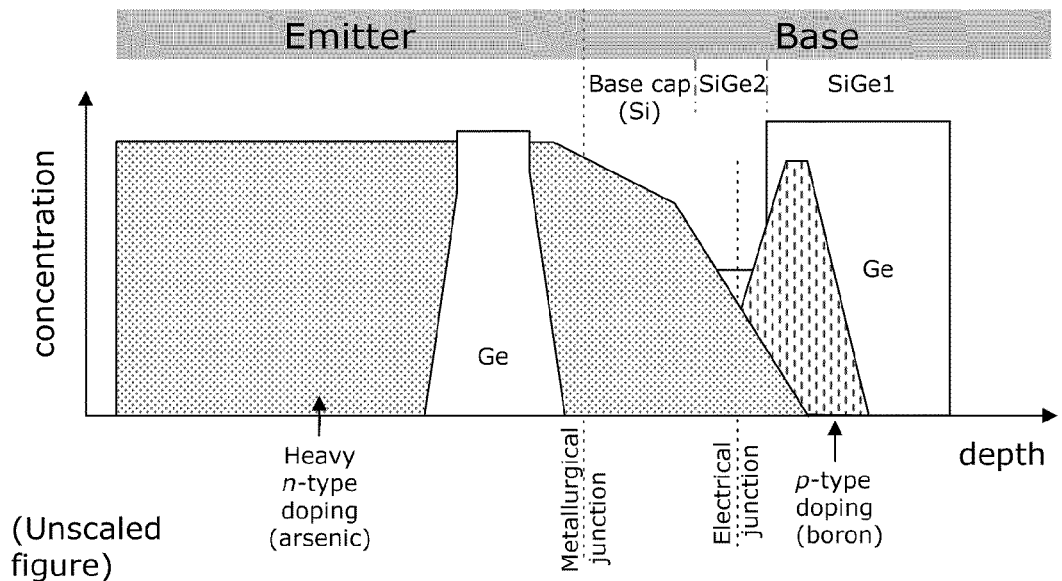
FIG. 2a represents schematically the emitter-base heterojunction of FIG. 1a, upon (performing or after having performed a) rapid thermal anneal, the junction being electrically activated (the transition region or the emitter-base interface region in FIG. 2a represents the region from the metallurgical junction up to (and including) the SiGe2 region).
Figure 2B:
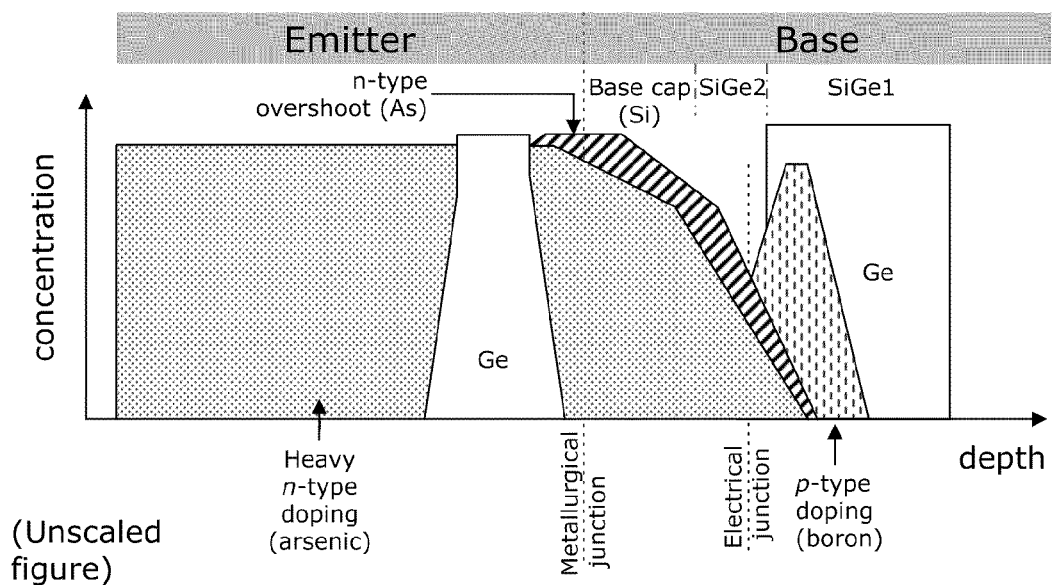
FIG. 2b represents schematically the emitter-base heterojunction of FIG. 1b, upon (performing or after having performed a) rapid thermal anneal, the junction being electrically activated.

FIG. 2a (and FIG. 2b) represents schematically the Si/SiGe heterojunction of the bipolar transistor of FIG. 1a (and FIG. 1b, respectively) after applying a rapid thermal treatment (or anneal). As shown in FIG. 2a (and FIG. 2b), the junction is electrically activated (upon applying said rapid thermal treatment) and the emitter-base n-p (electrical) junction occurs in the layer SiGe2.

For a good performance of the heterojunction bipolar transistor, several requirements need to be fulfilled: (a) a high doping level in the emitter region (to reduce the emitter resistance), typically above $1 \times 10^{20}$ atoms/cm$^3$; (b) a sharp (i.e. abrupt, or steep) doping (concentration) profile at the emitter-base interface (e.g. in FIG. 1a and FIG. 1b); (c) a good control over the location of the electrical emitter-base junction (i.e. control of the electrical junction depth, given by the quality of the VPD/ALE process control), preferably positioned in the SiGe layer with low Ge content (e.g. SiGe2 in FIG. 2a and FIG. 2b, i.e. the electrical emitter-base junction preferably not being spread over the whole base thickness). In case of a base region with a ramped Ge profile, the in-diffusion depth should be reproducible (i.e. electrical emitter-base junction positioned at a fixed Ge content). A typical thickness of the base Si cap layer is about 7-15 nm, which means that the (electrical) junction depth should be lower than 15 nm, preferably lower than 7 nm, the depth being measured from the metallurgical junction.

When the fabrication of a bipolar transistor is performed in a BiCMOS process flow, the (rapid) thermal anneal that drives the dopants from the emitter layer into the base region also serves as a HDD (Highly Doped Drain) activation anneal for the CMOS part of the device. This step, which consists of a spike (i.e. rapid thermal) anneal occurring after the deposition of the emitter layer/region, is usually fixed by the optimization of the CMOS-process flow and provides a relatively high thermal budget. A typical spike anneal for CMOS flow is a rapid thermal treatment (or anneal) at a temperature higher than 1050° C., e.g. at 1085° C.

The thermal budget of the spike anneal determines the in-diffusion depth of the emitter dopants and the position of the electrical emitter-base junction, which has a direct impact on the device characteristics. The method of the invention allows to control the effect of a high thermal budget activation anneal on dopant in-diffusion.

In general, forming a perfect sharp (i.e. box-shaped) dopant (concentration) profile at the emitter-base interface region is hampered by the lack of abruptness of the transition region between the emitter layer and the substrate (i.e. base cap), especially for highly-doped layers with e.g. arsenic introduced by an in-situ doping process in a chemical vapor deposition chamber.

The difficulty of realizing abrupt (i.e. steep) transitions (or (concentrations) profiles) originates both in the poor surface adhesion of the dopant (e.g. As, P, B) and the strong surface segregation of the dopant during growth. The segregation effect results in an incorporated bulk concentration lower than that the surface concentration by several orders of magnitude. These combined effects lead to a 'corner-rounded' (or an undershoot) of the concentration profile at the emitter-base interface in the as-deposited structures (illustrated in FIG. 1a), instead of the intended box-shape (i.e. steep) profile (as illustrated in FIG. 2a).

The invention discloses a method for manufacturing a junction with a controlled dopant (concentration) profile comprising:

forming a first semiconductor material comprising a first dopant having a first concentration and thereupon forming a second semiconductor material comprising a second dopant having a second concentration, thereby forming a (physical/metallurgical) junction, and depositing by Atomic Layer Epitaxy or Vapor Phase Doping at least a fraction of a monolayer of a precursor suitable to form the second dopant on the first semiconductor material, prior to forming the second semiconductor material, thereby increasing locally the second concentration of the second dopant at the (physical/metallurgical) junction.

In various embodiments of the invention the term 'controlled dopant (concentration) profile' refers to steep (i.e. abrupt/box-shaped) (concentration) profile of the second dopant at the junction in the as-deposited structures/layers. This can be achieved by increasing locally the second concentration (or creating an overshoot) of the second dopant at the junction. In line with the above, steepening the second dopant (concentration) profile at the emitter-base junction means controlling (or creating an overshoot in) the second dopant (concentration) profile at the junction (i.e. at the metallurgical junction, before the step of performing the rapid thermal anneal, and subsequently, at the electrical junction, after having performed the rapid thermal anneal).

In different embodiment of the invention, the first semiconductor material and the second semiconductor material are made of the same material and have the same composition, thereby forming a homojunction.

In other embodiments of the invention the first semiconductor material and the second semiconductor material are made of different materials or have different compositions, thereby forming a heterojunction.

The method of the invention may comprise additional steps in between forming a first semiconductor material comprising a first dopant and forming a second semiconductor material comprising a second dopant. In case of a BiCMOS process flow, the emitter growth is not performed in the same process step as the base growth. The process flow may comprise at least a photolithographic step for emitter window definition. However, in all cases the emitter layer/region is overlying and in contact with the base region/stack.

The method of the invention allows the control of the dopant (concentration) profile at the emitter-base interface. Locally a dopant containing layer (of high dopant concentration) is provided that is used as a dopant reservoir for the in-diffusion during the subsequent (rapid) thermal treatment (or activation anneal).

Vapor Phase Doping (VPD) is a Chemical Vapor Deposition (CVD) process wherein species (i.e. precursors) suitable to form dopants are deposited directly from the gas phase onto a substrate (e.g. a semiconductor material) through pyrolysis of a precursor gas, such as e.g. diborane ($B_2H_6$) for p-type doping and phosphine ($PH_3$) or arsine ($AsH_3$) for n-type doping.

Preferably, the precursors are diluted in hydrogen gas ($H_2$), or in an inert gas, such as nitrogen gas ($N_2$) or argon (Ar).

The precursors used in manufacturing are mostly diluted in hydrogen (i.e. mixtures of the species suitable to form dopants and $H_2$).

Forming a dopant containing layer has to be performed at a temperature lower than the corresponding dopant desorption limit for the n-type dopants (As, P) and, respectively, lower than the dopant in-diffusion limit for the p-type dopants (B). The dopant desorption limit is defined as the temperature at which the dopants start to desorb from the substrate. The dopant in-diffusion limit is defined as the temperature at which the dopants start to diffuse into the substrate.

Typical examples of n-type dopant precursors are arsine ($AsH_3$) and phosphine ($PH_3$). Advantageously, forming an arsine/phosphine containing layer is performed at a temperature lower or equal to the dopant desorption limit. In case of arsine, the dopant desorption limit is 600° C. The dopant desorption limit put also a constraint on the deposition temperature of the epitaxial overgrowth of a semiconductor material as referred to elsewhere in the description.

A typical example of a p-type dopant precursor is diborane ($B_2H_6$). Advantageously, forming a diborane containing layer is performed at a temperature lower or equal to the dopant in-diffusion limit.

When the dopant deposition step from the gas phase in the Vapor Phase Doping process occurs epitaxially on the substrate and when the amount of dopants (or dopant dose) can be atomically controlled (typically at lower temperatures then usual VPD), the technique is also known as Atomic Layer Epitaxy (ALE). Atomic Layer Epitaxy is a chemical vapour deposition (CVD) process wherein dopant atoms chemisorb on a heated substrate through the thermal decomposition from a gaseous precursor (e.g., $AsH_3$, $PH_3$, $B_2H_6$). In the case of n-type doping, the chemisorption mechanism is self-limiting resulting in one single atomic layer (i.e. one monolayer) of dopant atoms (illustrated in FIG. 3). In the case of p-type doping, the self-limitation can be observed only at very low temperature, of the order of 100° C.

Figure 3:
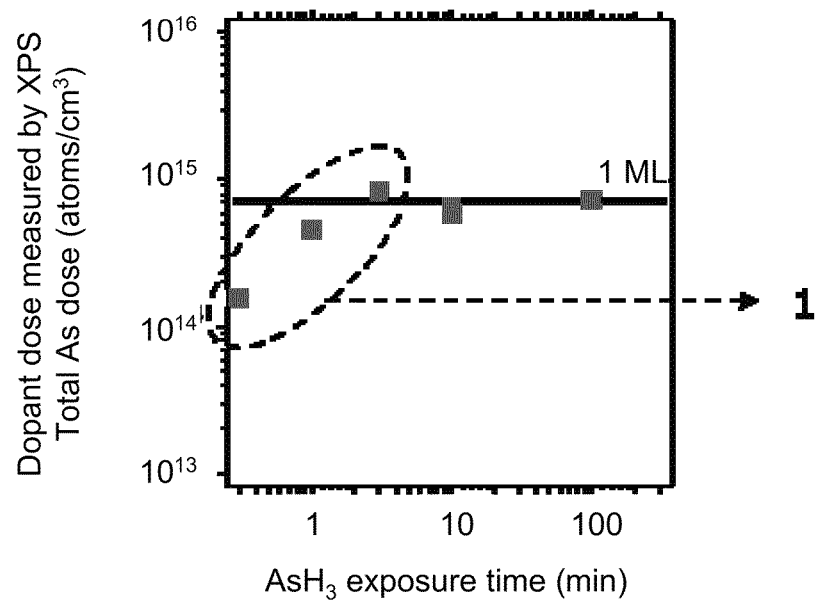
FIG. 3 represents the Arsenic (As) dose as measured by X-Ray photoelectron spectroscopy (XPS) on as-deposited material as function of the exposure time to the precursor gas ($AsH_3$) in the CVD reactor.

In the case of n-type doping (e.g. with As) the deposition is self-limited to 1 monolayer (ML). Below 1 ML, the deposited dose is determined by the duration of the exposure to the gaseous precursor ($AsH_3$), as shown in FIG. 3 in the region labeled with (1).

Figure 4:
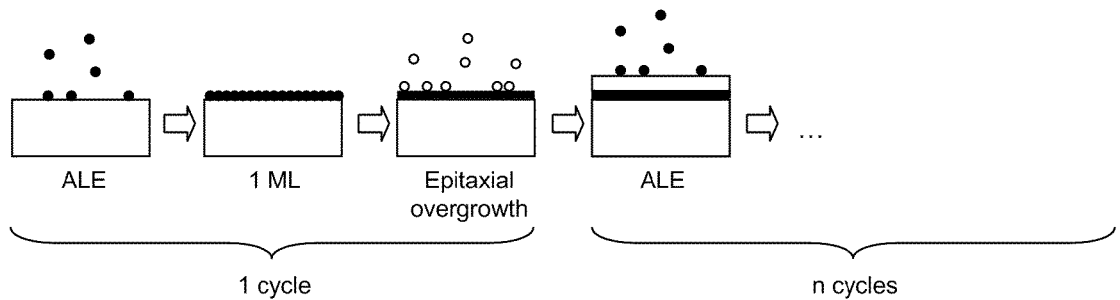
FIG. 4 represents schematically the process sequence comprising an Atomic Layer Epitaxy (ALE) step and an epitaxial (over)growth step repeated n-times (or n-cycles) to achieve a dopant dose exceeding the dopant solid solubility.

Atomic Layer Epitaxy can be applied for in-situ doping of a semiconductor material. In this case, a layer of a semiconductor material (e.g. Si, Ge or SiGe) is epitaxially grown on top of a dopant layer already formed as illustrated in FIG. 4.

The self-limitation of ALE to 1 monolayer of dopant is an additional advantage, since the dopant atoms can all be incorporated in substitutional sites during the epitaxial (over) growth of the semiconductor material. The growth processes are non-equilibrium processes which can be performed below the surface diffusion temperature of the dopants (related to the kinetics of the deposition process). In this way, very high active levels of doping can be obtained, above the dopant solid solubility. When the chemisorption is done on a Si (100) surface, the saturation dose (i.e. the dose of one monolayer) corresponds to a surface concentration of about $6.8 \times 10^{14}$ atoms/$cm^2$.

The basic sequence that combines a dopant deposition step followed by the epitaxial overgrowth of a semiconductor layer can be repeated several times (or cycles). Each time, the overgrown semiconductor layer provides a fresh surface which allows the formation of a new dopant layer. This process is represented schematically in FIG. 4.

Embodiments of the invention disclose depositing at least a fraction of a monolayer of a precursor suitable to form a dopant at a pressure between about 0.1 Pa and about 1 atm (101 kPa). The reaction chamber can be, for example, an epitaxial reactor, a low pressure chemical vapor deposition (LPCVD) chamber, a reduced pressure chemical vapor deposition (RPCVD) chamber, an atmospheric pressure chemical vapor deposition (APCVD) chamber or a ultra high vacuum chemical vapor deposition (UHVCVD) chamber, or a gas source molecular beam epitaxy chamber (GSMBE).

In specific embodiments of the invention a method is disclosed to improve the steepness of the doping profile at the interface between the emitter and the base region of a bipolar transistor (when compared to methods described in the art). Secondly, the method allows a good (or improved) control of the in-diffusion depth of the dopants at the emitter-base interface of a bipolar CMOS, upon applying the conventional activation anneal of the CMOS flow (when compared to methods described in the art).

Since the as-deposited dose can be varied with continuous values between 0 and 1 ML, ALE can be tuned to fit the profile steepness at the (emitter-base) interface and, at the same time, the diffusion length in the base (upon rapid thermal anneal).

The bulk of the emitter can be grown either by conventional in-situ doping techniques (e.g. Chemical Vapour Deposition (CVD)) or by performing multiple cycles of ALE.

The emitter region can comprise multiple layers, each of them being epitaxially grown.

The sequence of dopant deposition (ALE) and epitaxial overgrowth of a semiconductor material such as Si, Ge, SiGe is repeated several times (FIG. 4). Because the overgrown layer provides a fresh surface for the dopant atoms, the dopant dose can be increased to any arbitrary value, provided that a sufficient amount of cycles is performed. Due to the layer growth, the thickness of the structure increases with the number of cycles.

If the exposure time is short enough during the ALE step, the substrate surface is not saturated by dopants. By an adequate choice of the exposure time, it is possible to tune the as-deposited dose at the required value (see e.g. FIG. 3 in the region labeled with (1)).

If ALE is followed by a (rapid) thermal treatment (or anneal), the dopant atoms will be activated in the semiconductor material. The maximum active dopant level that can be achieved is determined by the solid solubility limit at the anneal temperature. In the case of n-type dopants, without the deposition of a capping layer (or overgrown semiconductor material) immediately after the ALE step, most of the adsorbed atoms will desorb during the anneal step at temperatures higher than 550° C.-600° C. Therefore the semiconductor material must be grown/deposited at a temperature lower than the desorption temperature, to act as a protective cap layer with minimal alteration of the as-deposited dopant dose.

In FIG. 5a (and FIG. 5b), secondary ion mass spectrometry (SIMS) measurements of the As concentration in the emitter layer are shown for 4 samples in the neighborhood of the physical interface between the emitter region (left hand side of the figure) and the base region (right hand side of the figure) (said transition region between the emitter region and the (base cap of the) base region being indicated with a dashed rectangle on FIGS. 5a and 5b and on top of said figures). In the as-deposited sample with the ALE (curve 3), the problem of the corner-rounded profile (curve 1) is solved, obtaining even a dopant concentration peak, with a magnitude of $6.2 \times 10^{20}$ atoms/$cm^3$ (i.e., $cm^{-3}$) This magnitude of the concentration peak corresponds to 1 ML of As, but can be tuned/controlled towards lower values, upon the requirements of a particular device, by depositing a fraction of a monolayer of arsine. The possibility to control the dopant overshoot (or concentration peak magnitude) is a particular advantage of the invention.

As a positive effect of ALE, the As concentration in the region (between −5 nm to −10 nm in said figure) of the overgrown layer close to the ALE peak (curve 3) is more uniform, compared to the profile of the sample without ALE (curve 1). Without being bound to theory, it is believed that the small dip in dopant (As) concentration at −14 nm is most probably due to the presence of Ge in the emitter or to a calibration issue of the SIMS measurement due to the presence of Ge.

After a spike anneal at 1085° C., the dopant (concentration) profile of the sample using ALE (curve 4) shows deeper in-diffusion compared to that of the sample without ALE (curve 2). The difference is due to the high amount of dopant (1 ML) that is available from the ALE, which acts as a reservoir of dopant atoms during the drive-in anneal. As indicated above, this amount of dopant can be reduced to a fraction of a monolayer in order to adjust the in-diffusion depth upon needs.

Figure 6A:
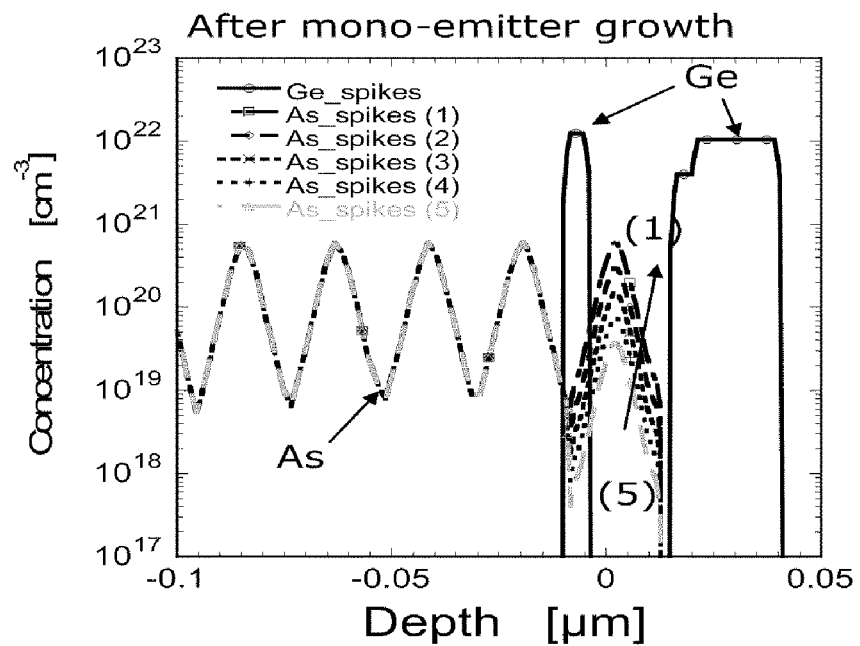
FIG. 6a (and FIG. 6b) represents the results of the Technology Computer Aided Design (TCAD) simulations of an emitter grown using ALE (i.e. depicting the Ge and As concentration (atoms/cm$^3$) versus the depth of the substrate (μm) after mono-emitter growth and after performing a spike anneal, respectively).

FIG. 6a (and FIG. 6b) represents the results of TCAD simulations of an emitter grown using the (multiple) ALE.

Figure 6B:
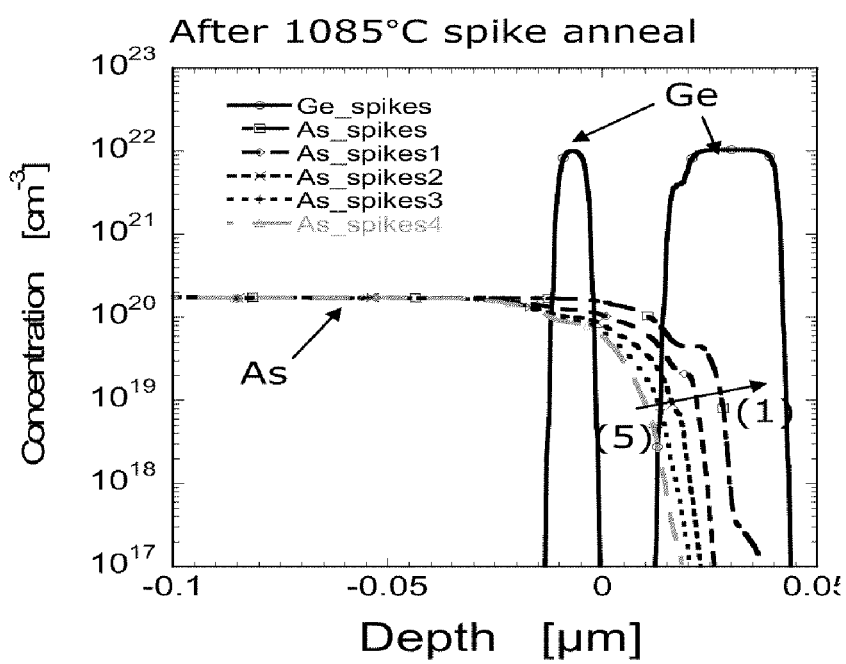

FIG. 6a shows the ALE peaks (1) (grey) to (5) (dashed black) with increasing magnitude. FIG. 6b shows the corresponding in-diffusion depth after a spike anneal at 1085° C. for the ALE peaks (1) to (5).

The simulations show that a proper tuning of the magnitude of the ALE peak close to the emitter/base interface allow to control the in-diffusion length after (or upon) the (rapid) thermal anneal.

The higher the ALE peak magnitude (i.e. the distance measured from the top of the (grey) peak (1) to the top of the (black-dashed) peak (5) in FIG. 6a the higher is the in-diffusion depth (measured in microns on the x-scale) in the direction indicated by the arrow in FIG. 6b (i.e. from the grey curve (1) to the black-dashed curve (5)). Upon anneal, the other ALE peaks in the bulk emitter region are leveled off at the same bulk concentration in the emitter.

The present invention can be applied in different areas of semiconductor device manufacturing. While the invention is described in conjunction with a bipolar transistor and more particularly to a bipolar CMOS (BiCMOS) device, it will be apparent to those ordinary skilled in the art that the benefits of this invention can be applied to other applications. Another possible application is growing thin highly doped semiconductor layers on a substrate. The method of the invention can be used e.g. to form thin n+ Si layer for photovoltaic applications or to control the dopant (concentration) profile at the emitter-base junction in a photovoltaic device.

It is to be understood that although preferred embodiments, specific constructions and configurations, as well as materials, have been discussed herein for devices according to the present invention, various changes or modifications in form and detail may be made without departing from the scope of this invention as defined by the appended claims.

The invention claimed is:

1. A method for manufacturing a junction with a controlled dopant profile, the method comprising:
   forming a first semiconductor material doped with a first dopant; then
   depositing directly on the first semiconductor material by Atomic Layer Epitaxy or Vapor Phase Doping at least a fraction of a monolayer of a precursor for a second dopant different than the first dopant, the deposition of the precursor for the second dopant being performed without concomitant deposition of a semiconductor material; then
   forming a second semiconductor material doped with the second dopant on the precursor of the second dopant and the first semiconductor material, then
   performing a rapid thermal treatment performed after the formation of the second semiconductor material doped with the second dopant,
   thereby forming a junction between the first semiconductor material and the second semiconductor material,
   wherein the amount of precursor for the second dopant deposited in the deposition step is selected such that the concentration of the second dopant in the second semiconductor material is higher at the junction between the first semiconductor material and the second semiconductor material than it is in the bulk second semiconductor material.

2. The method according to claim 1, wherein the first semiconductor material and the second semiconductor material have the same composition, thereby forming a homojunction.

3. The method according to claim 1, wherein the first semiconductor material and the second semiconductor material have different compositions, thereby forming a heterojunction.

4. The method according to claim 1, wherein forming the second semiconductor material doped with the second dopant comprises
   performing a sequence consisting of
      epitaxially growing a layer of a second semiconductor material, and then
      depositing on the layer of second semiconductor material by Atomic Layer Epitaxy a monolayer of a precursor suitable to form the second dopant, and
   repeating the sequence at least twice, thereby incorporating the second dopant in substitutional sites in the second semiconductor material.

5. The method according to claim 1, wherein the concentration of the second dopant in the bulk second semiconductor material is greater than or equal to $1\times10^{20}$ atoms/cm$^3$.

6. The method according to claim 1, wherein the first dopant is an n-type dopant, and the second dopant is a p-type dopant; or the first dopant is a p-type dopant, and the second dopant is an n-type dopant.

7. The method according to claim 6, wherein the n-type dopant is arsenic (As) or phosphorus (P).

8. The method according to claim 7, wherein the precursor suitable to form the n-type dopant is arsine ($AsH_3$) or phosphine ($PH_3$).

9. The method according to claim 6, wherein the p-type dopant is boron.

10. The method according to claim 6, wherein first dopant is a p-type dopant, and the second dopant is an n-type dopant.

11. The method according to claim 1, wherein the second semiconductor material comprises Si, Ge or combinations thereof.

12. The method according to claim 1, wherein the second semiconductor material is an emitter region of a bipolar transistor, and the junction is a semiconductor junction.

13. The method according to claim 1, wherein the first semiconductor material comprises Si, Ge or combinations thereof.

14. The method according to claim 1, wherein the first semiconductor material is a base region of a bipolar transistor.

15. The method according to claim 1, further comprising a rapid thermal treatment performed after the formation of the second semiconductor material doped with the second dopant.

16. The method according to claim 15, wherein upon the rapid thermal treatment in diffusion depth of the second dopant into the first semiconductor material is less than or equal to 15 nm.

17. Use of the method according to claim 1 for the manufacture of a bipolar CMOS (BiCMOS) device.

18. Use of the method according to claim 1 for the manufacture of a photovoltaic device.

* * * * *